United States Patent
Majewski et al.

[11] Patent Number: 6,148,761
[45] Date of Patent: Nov. 21, 2000

[54] DUAL CHANNEL GAS DISTRIBUTION PLATE

[75] Inventors: Robert Majewski, Scotts Valley; Yeh-Jen Kao, San Jose; Yen Kun Wang, Fremont, all of Calif.

[73] Assignee: Applied Materials, Inc., Santa Clara, Calif.

[21] Appl. No.: 09/207,780

[22] Filed: Dec. 9, 1998

Related U.S. Application Data

[60] Provisional application No. 60/089,413, Jun. 16, 1998.

[51] Int. Cl.[7] .................................................. C23C 16/00
[52] U.S. Cl. .......................................... 118/715; 118/719
[58] Field of Search .............................................. 118/715

[56] References Cited

U.S. PATENT DOCUMENTS

| | | | |
|---|---|---|---|
| 4,209,357 | 6/1980 | Gorin et al. | 156/643 |
| 4,951,603 | 8/1990 | Yoshino et al. | 118/719 |
| 5,000,113 | 3/1991 | Wang et al. | 118/723 |
| 5,252,131 | 10/1993 | Kiyama et al. | 118/719 |
| 5,314,724 | 5/1994 | Tsukune et al. | 427/489 |
| 5,624,498 | 4/1997 | Lee et al. | 118/715 |
| 5,683,940 | 11/1997 | Yahiro | 437/195 |
| 5,700,720 | 12/1997 | Hashimoto | 437/195 |
| 5,792,269 | 8/1998 | Deacon et al. | 118/715 |

FOREIGN PATENT DOCUMENTS

| | | |
|---|---|---|
| 0687749A1 | 12/1995 | European Pat. Off. . |
| 0821084A1 | 1/1998 | European Pat. Off. . |

*Primary Examiner*—Shrive Beck
*Assistant Examiner*—Norca L. Torres
*Attorney, Agent, or Firm*—Thomason, Moser & Patterson

[57] ABSTRACT

A multi-channel faceplate 200, that in some embodiments is monolithic, is provided as a portion of a gas delivery system to a process chamber 100. At least two sets of gas pathways are disposed through a faceplate and allow for independent delivery of separate gases into a process chamber 100. In one embodiment, a first gas pathway, which includes a first set of vertical channels 226, is formed through the faceplate 200. A second gas pathway includes a second set of vertical channels 228, which is formed through a portion of the faceplate and connected to a set of interconnecting horizontal channels 222 in the faceplate 200, where the second gas pathway maintains fluidic separation from the first gas pathway, prior to the gases entering the process chamber 100.

19 Claims, 11 Drawing Sheets

DUAL CHANNEL GAS DISTRIBUTION PLATE

This application claims priority of U.S. Provisional Patent Application Serial No. 60/089,413, filed Jun. 16, 1998.

BACKGROUND OF THE INVENTION

1. Field of the Invention

The present invention generally relates to the field of semiconductor substrate processing equipment. More particularly, the present invention relates to a gas distribution system which provides separate and uniform delivery of two or more gases into a processing chamber.

2. Background of Related Art

In the fabrication of integrated circuits, vacuum process chambers are generally employed to process semiconductor substrates. The processes carried out in the vacuum chambers typically provide the deposition or etching of multiple metal, dielectric, and semiconductor layers on the surface of a substrate. Examples of such processes include chemical vapor deposition (CVD), physical vapor deposition (PVD), and etching processes. Many processing chambers include a gas distribution system to effectuate depositions, etching, and so forth. Dry etching of semiconductor materials can also be conducted with chemical vapor transport systems to selectively remove desired areas of such materials to form a desired pattern or configuration on a substrate.

Figure 1:
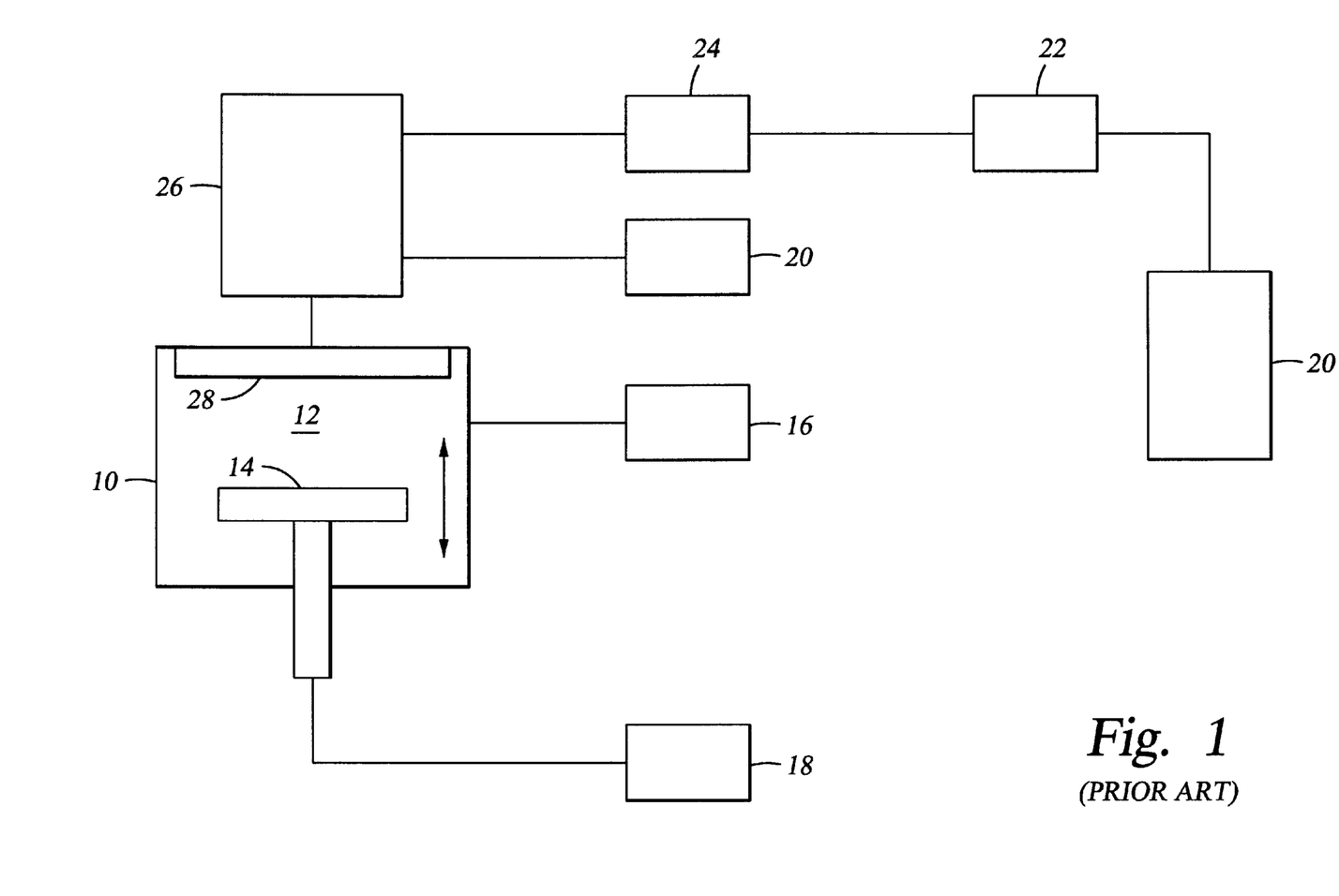
FIG. 1 is a schematic diagram of a prior art CVD chamber.

To better understand the integration of a gas distributing system in a processing chamber, FIG. 1 is a schematic diagram showing the construction of a typical CVD chamber 10. The chamber 10 generally defines a processing region 12 and houses a vertically movable substrate support member 14. Containers 20 are provided to supply a variety of gases needed to carry out the processes in the chamber 10. A vaporizer 22 is provided to heat and vaporize one or more liquid precursors, while a flow controller 24 governs the rate at which gases are delivered into the chamber 10. For processes requiring multiple gases, the chamber 10 typically includes an upstream premixing chamber 26, wherein process gases are combined prior to being introduced into the processing region 12.

Figure 2:
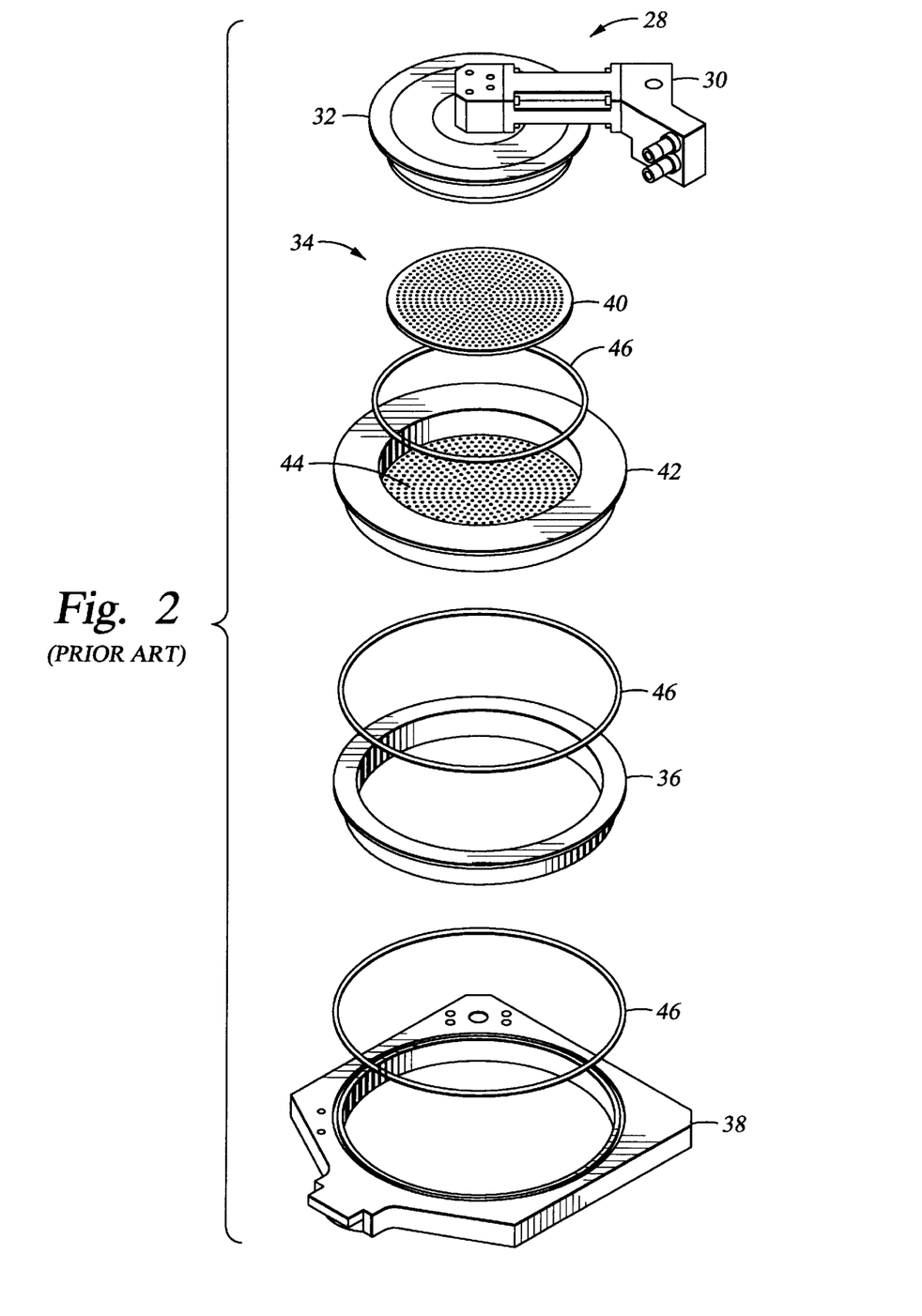
FIG. 2 is an exploded diagram, depicting the components of a prior art gas distribution system.

Gas delivery into the chamber 10 is accomplished by a gas distribution assembly 28, shown in detail in FIG. 2, consisting of a gas manifold 30, a gas box 32 (or gas injection cover plate), a showerhead assembly 34, and an isolator 36, all of which are mounted on an electrically grounded chamber lid 38. The showerhead 34 typically comprises a perforated blocker plate 40 and a faceplate 42 having an array of holes 44. Both the blocker plate 40 and the faceplate 42 are generally flat circular members through which gases are diffused or passed to provide a uniform concentration of gases over the substrate surface. A cavity between the blocker plate 40 and the gas box 32 also serves as an additional agitation stage to continue mixing the process gases. O-rings 46 are disposed between the various components to help ensure hermitic seals to prevent leakage of the gases. In operation, the process gases are pumped into the CVD chamber 10 to effectuate deposition onto a substrate.

Improvements in gas distribution systems are needed, because as integrated circuit density increases and feature size decreases, new materials having low dielectric constants in plasma-less deposition are being developed. In the area of dielectrics, for example, silicon dioxide ($SiO_2$) is formed by mixing methylsilane ($SiH_3CH_3$) and hydrogen peroxide ($H_2O_2$). These chemicals undergo a condensation reaction on a cooled substrate to form a porous oxide network.

Critical to the use of $H_2O_2$ and $SiH_3CH_3$ is keeping the chemicals separate during delivery into the chamber to prevent them from reacting prior to their introduction into a processing region of a vacuum chamber. Allowing a reaction to occur at any point upstream of the processing region results in clogging of equipment components, such as the faceplate 42 and blocker plate 40 of a vacuum chamber gas distribution assembly. Once the gas distribution plates are obstructed, the gases no longer uniformly distribute across the surface of the substrate and nonconformal deposition patterns can result, thereby producing defective devices. In order to clean the gas distribution plates, production must be interrupted and the gas delivery system must be disassembled, serviced, and reassembled.

One attempt to provide a dual channel delivery showerhead is shown in U.S. Pat. No. 5,624,494 entitled "Showerhead for a Gas Supplying Apparatus." The showerhead arrangement disclosed includes two separate perforated plates, each providing a separate gas pathway, joined at an interface. A first set of holes is formed in both a top plate and a bottom plate and must be aligned when the plates are assembled to form a continuous channel through both plates. A second pathway is defined by a third set of vertical holes formed in the bottom plate and fluidly connected by a set of horizontal recesses also formed in the bottom plate. Concentric gas pipes separately deliver reactive gases to the first and second pathways, which then route the gases into a process chamber for mixing and deposition on to a substrate.

One difficulty encountered with this gas plate is achieving the alignment of the holes formed within the two perforated plates. This alignment is critical and is difficult to achieve. Another problem is ensuring a gas-tight seal between the plates to prevent leakage between the holes. As a consequence, the reactive gases migrate through the interstitial spaces formed between the plates and holes and deposit thereon. For processes involving reactive gases, such as $H_2O_2$ and $SiH_3CH_3$, the resulting chemical compound clogs the gas delivery system and ultimately leads to a non-uniform deposition pattern on the substrates. Furthermore, the blockage requires, at a minimum, cleaning of the showerhead. Substantial blockage may also use upstream pumping equipment and require their maintenance or replacement.

A need, therefore, exists for a gas distribution assembly which provides for separate introduction of gases into a process chamber which uniformly delivers gases onto a substrate without the above blockage problems.

SUMMARY OF THE INVENTION

The present invention generally provides a substrate processing chamber, apparatus, and associated methods, having a gas distribution system that provides separate and uniform distribution of two or more gases within the processing chamber. In one embodiment, the invention provides an apparatus for distributing gases within a processing chamber comprising a monolithic multi-channel faceplate. A first gas pathway, having a first set of vertical channels, extends through the faceplate. A second gas pathway, having a second set of vertical channels intersecting a set of horizontal channels, is separated from the first gas pathway through the monolithic faceplate. Separate gas supplies deliver gases to each of the gas pathways. This faceplate may be particularly useful in a plasma-less processing chamber. The faceplate separately delivers reactive gases into a processing region, which are mixed following delivery into the processing region and deposited on a substrate, which may be supported on a temperature-controlled support member. Naturally, other embodiments are possible.

In one embodiment, the present invention includes an apparatus for distributing gas in a processing system, comprising a monolithic multi-channel faceplate adapted to disperse gases into a process chamber, a first gas pathway through the monolithic multi-channel faceplate adapted to deliver a first gas to the process chamber, and at least a second gas pathway through the monolithic multi-channel faceplate, the second gas pathway adapted to deliver at least a second gas to the process chamber substantially separate from the first gas prior to delivery to the process chamber. In another embodiment, the present invention includes an apparatus for distributing gas in a processing system, comprising a multi-channel faceplate adapted to disperse gases into a process chamber, a first gas pathway through the faceplate comprising a first set of horizontal channels intersecting a first set of vertical channels for a first gas, at least a second gas pathway through the faceplate comprising a second set of horizontal channels disposed vertically offset with respect to the first set of horizontal channels and intersecting a second set of vertical channels separate from the first set of vertical channels. In yet another embodiment, the present invention includes a semiconductor processing apparatus, comprising a process chamber and a gas distribution system connected to the process chamber, the gas distribution system comprising a gas feedthrough fluidicly connected to a first and second gas source, a gas injection cover plate fluidicly connected on an upper side to the gas feedthrough, and a monolithic multi-channel faceplate connected to a lower side of the gas injection cover plate, the faceplate adapted for the separate delivery to the process chamber of two or more gases.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF A PREFERRED EMBODIMENT

The present invention generally provides a substrate processing chamber having a gas distribution system that provides separate and uniform distribution of two or more gases within the processing chamber. The present invention includes a semiconductor processing apparatus, having a process chamber and a gas distribution system connected to the process chamber, the gas distribution system including a gas feedthrough fluidicly connected to a first and second gas source, a gas injection cover plate fluidicly connected on an upper side to the gas feedthrough and a monolithic multi-channel faceplate connected to a lower side of the gas injection cover plate, the faceplate adapted for the separate delivery to the process chamber of two or more gases. A first gas pathway, having a first set of vertical channels, extends through the faceplate. A second gas pathway, having a second set of vertical channels intersecting a set of horizontal channels, is separated from the first gas pathway through the monolithic faceplate. Separate gas supplies deliver gases to each of the gas pathways. Naturally, other embodiments are possible.

Figure 3:
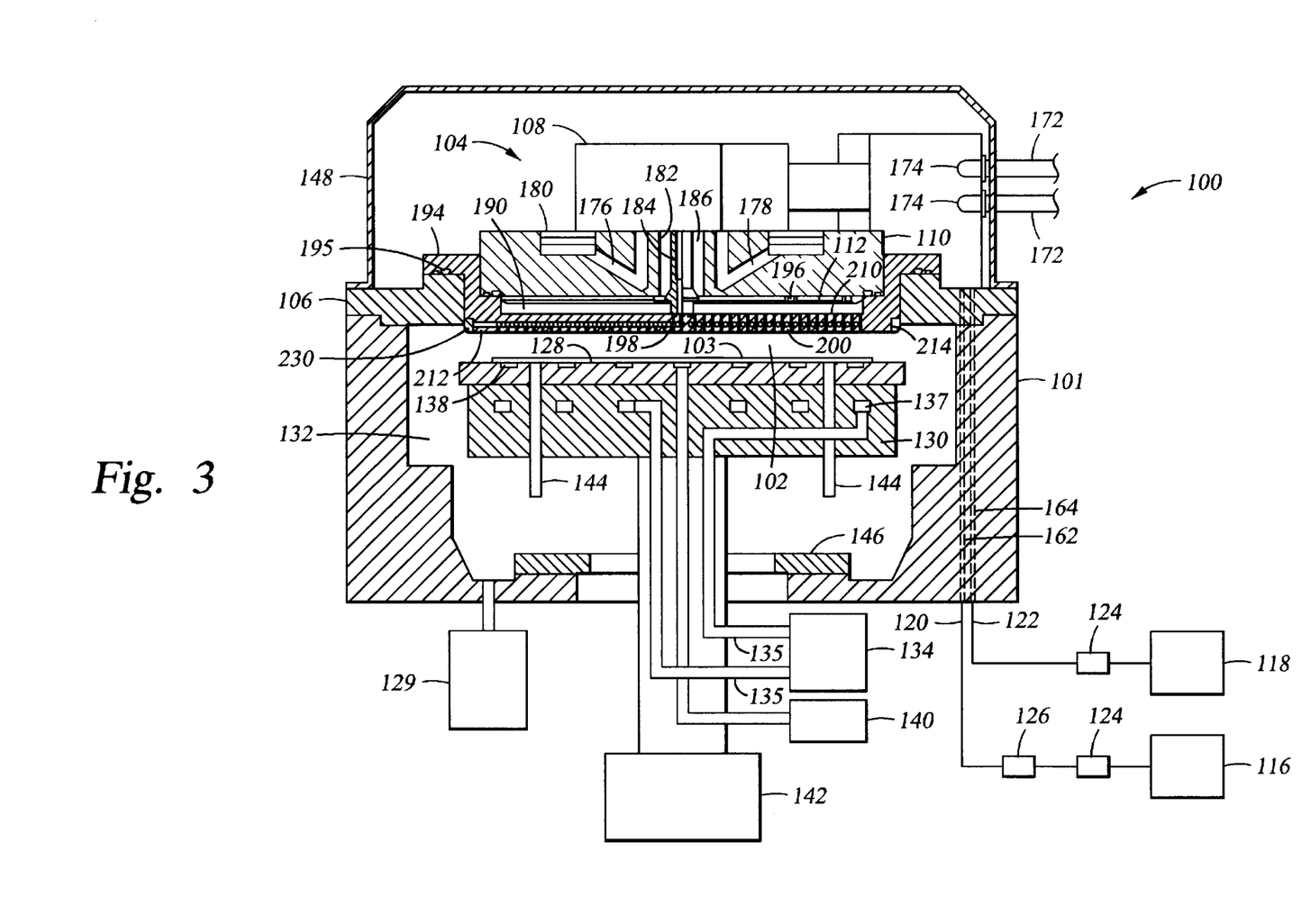
FIG. 3 is a partial cross sectional view of a process chamber.

FIG. 3 shows a cross sectional view of one embodiment of a processing chamber 100, incorporating the present invention. The chamber 100 generally includes a chamber body 101, enclosing a processing region 102, wherein chemical precursors are introduced during processing. A vertically movable temperature-controlled substrate support member 130 is disposed through a lower end of the chamber body 101 to support a substrate thereon. The substrate support member 130 includes a cooling channel 137, through which a fluid is passed to effect heating and/or cooling of the support member 130. An annular vacuum exhaust channel 132, connected to a vacuum pump 129, is provided to expel process gases from the processing region 102. A top gas distribution assembly 104 is disposed on a lid 106 to deliver gases into the chamber 100. The gas distribution assembly 104 comprises a gas feedthrough 108, a gas injection cover plate 110, a blocker plate 112, and a multi-channel faceplate 200. The faceplate 200 is shown incorporated into the chamber 100 as part of the gas distribution assembly 104, so that the faceplate 200 defines the upper limit of the processing region 102. The lid 106 mounts the faceplate 200 and supports the gas injection cover plate 110. O-rings 195, located in the flange 194, provide a seal between the flange 194 of the faceplate 200 and the lid 106. A cover 148 is disposed over the lid 106. The faceplate 200, described in detail below, is uniquely designed to separately deliver a first and a second precursor gas into the processing region 102 via gas channels. In general, the channels comprise a set of vertical and horizontal channels formed in the faceplate 200.

Figure 4:
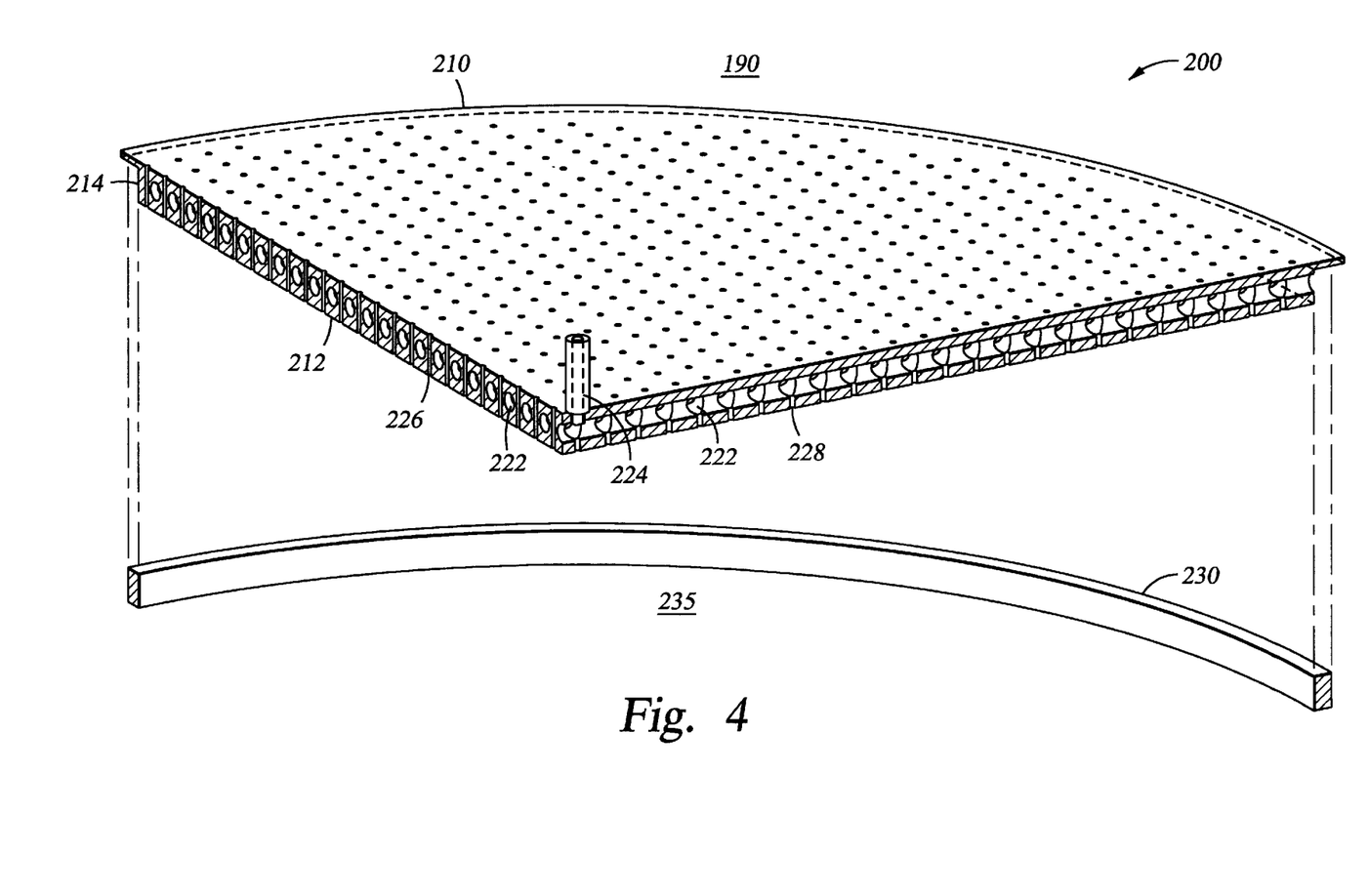
FIG. 4 is a partial cross sectional view of one embodiment of a monolithic multi-channeled faceplate of the present invention.
Figure 5:
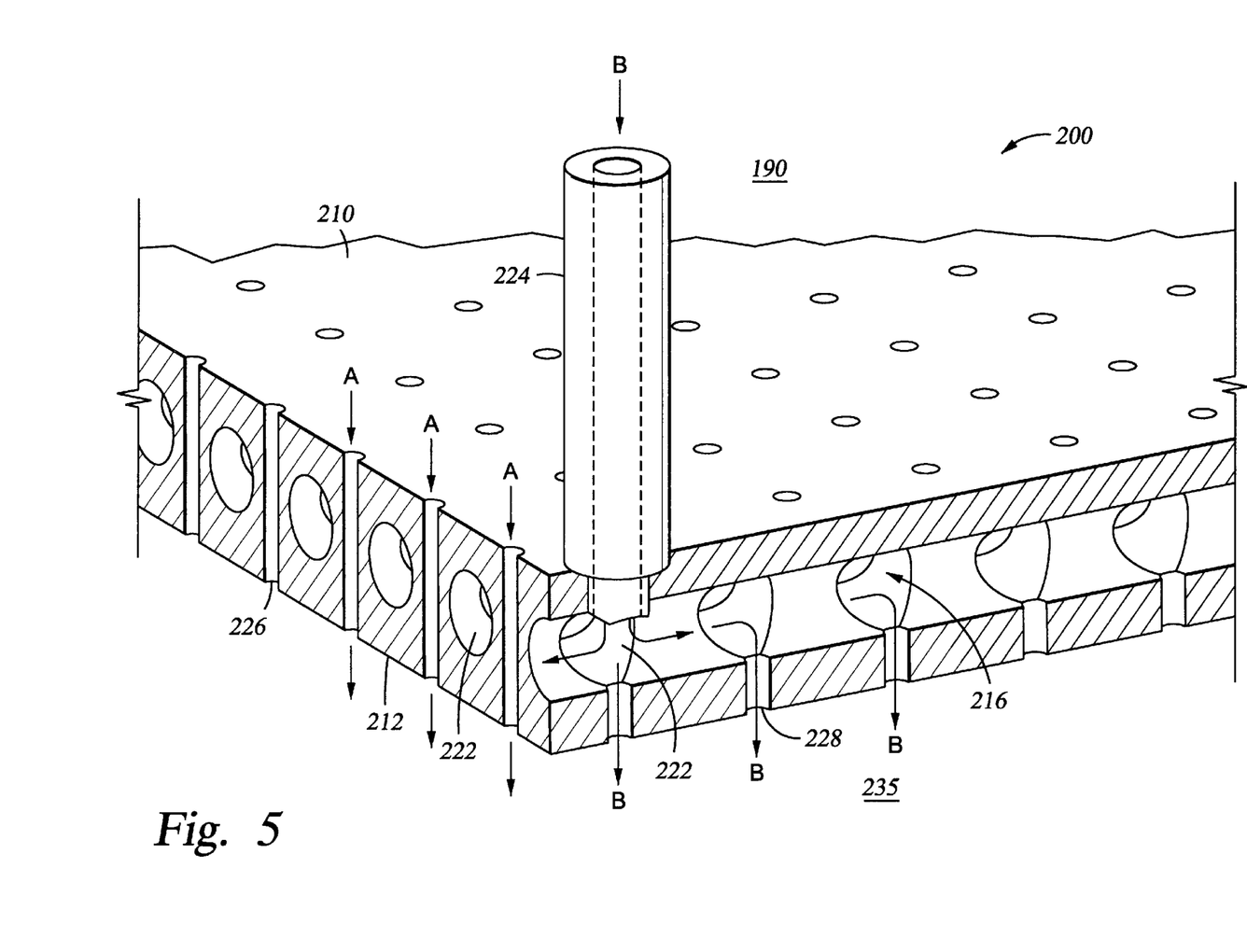
FIG. 5 is an enlarged partial cross sectional view of the faceplate of FIG. 4, having offset vertical channels.

FIGS. 4 and 5 are partial cross sectional views, detailing an embodiment of the faceplate 200 of the present invention. The faceplate 200 includes a top surface 210, a bottom surface 212, and a peripheral annular portion, or sidewall 214. A first gas pathway, represented in this embodiment by the arrow A in FIG. 5, includes a first set of vertical channels 226, which extends through the faceplate 200 to provide fluid communication between an upper region 190, adjacent the top surface 210, and lower region 235, adjacent the bottom surface 212, where an upper limit of the upper region 190 is defined by the gas injection cover plate 110, shown in FIG. 3. A second gas pathway, represented in this embodiment by the arrow B in FIG. 5, includes a second set of vertical channels 228, which extends through the bottom surface 212 and provide fluid communication between a set of horizontal channels 222 and the lower region 235. The horizontal channels 222 form a labyrinth of channels in the faceplate 200 between the top surface 210 and the bottom surface 212. The horizontal channels 222 may be formed by machining, ie., drilling through the sidewall 214, in a plane generally parallel with the top surface 210 and bottom surface 212 of the faceplate. The incident angle of the drill bit determines the final configuration of the set of horizontal channels 222, while the bit size determines their diameter. A central gas inlet, or nozzle 224, disposed perpendicularly through the top surface 210 is in fluid communication with the horizontal channels 222 and is received by a lower portion of a conduit 184, shown in FIG. 3. An annular ring 230, adapted to circumferentially abut the sidewall 214, hermetically seals the endpoints of the set of horizontal channels 222. To help ensure an airtight seal, the ring 230 and the sidewall 214 may be fused together. Alternatively, the endpoints of the horizontal channels 222 may be individually plugged.

Figure 6:
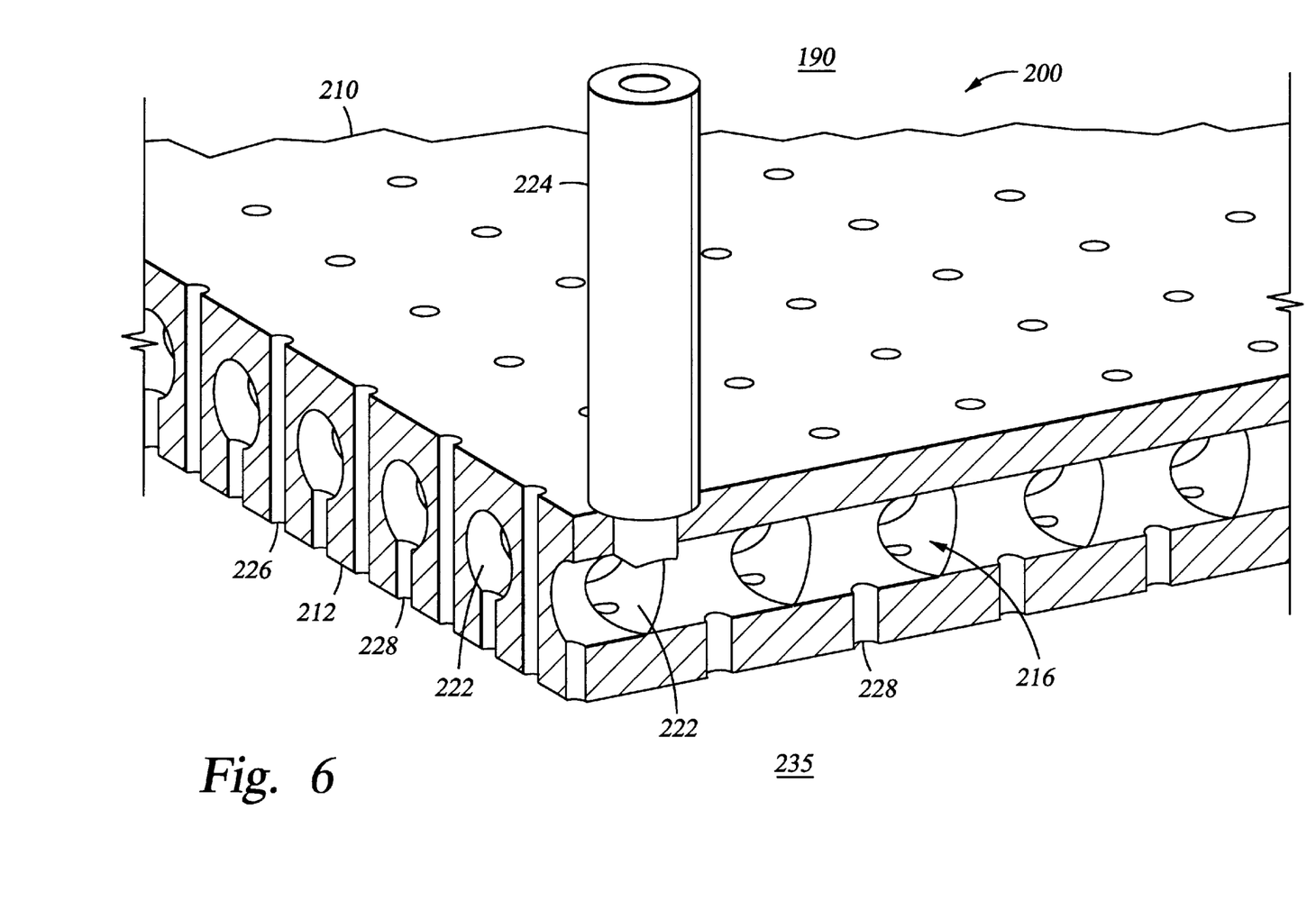
FIG. 6 is an enlarged partial cross sectional view showing a second embodiment of the present invention, having aligned vertical channels.

FIG. 4 and 5 also show the second set of vertical channels 228, originating from the intersections of the set of horizontal channels 222 and offset from the first set of vertical channels 226. However, the second set of vertical channels 228 could originate from any point along the horizontal channels 222. For example, as shown in FIG. 6, the second set of vertical channels 228 is shown aligned with, or adjacent to, the first set of vertical channels 226.

The faceplate 200 is preferably monolithic, i.e., machined or otherwise fabricated as a single piece of material, where the size and spacing of the holes may be varied according to the particular application, so that uniform delivery into the process chamber is achieved. Manufacturing the faceplate as a single piece of material avoids the problems encountered with aligning separate plates and preventing leakage of gases between plates and into separate channels.

Figure 7:
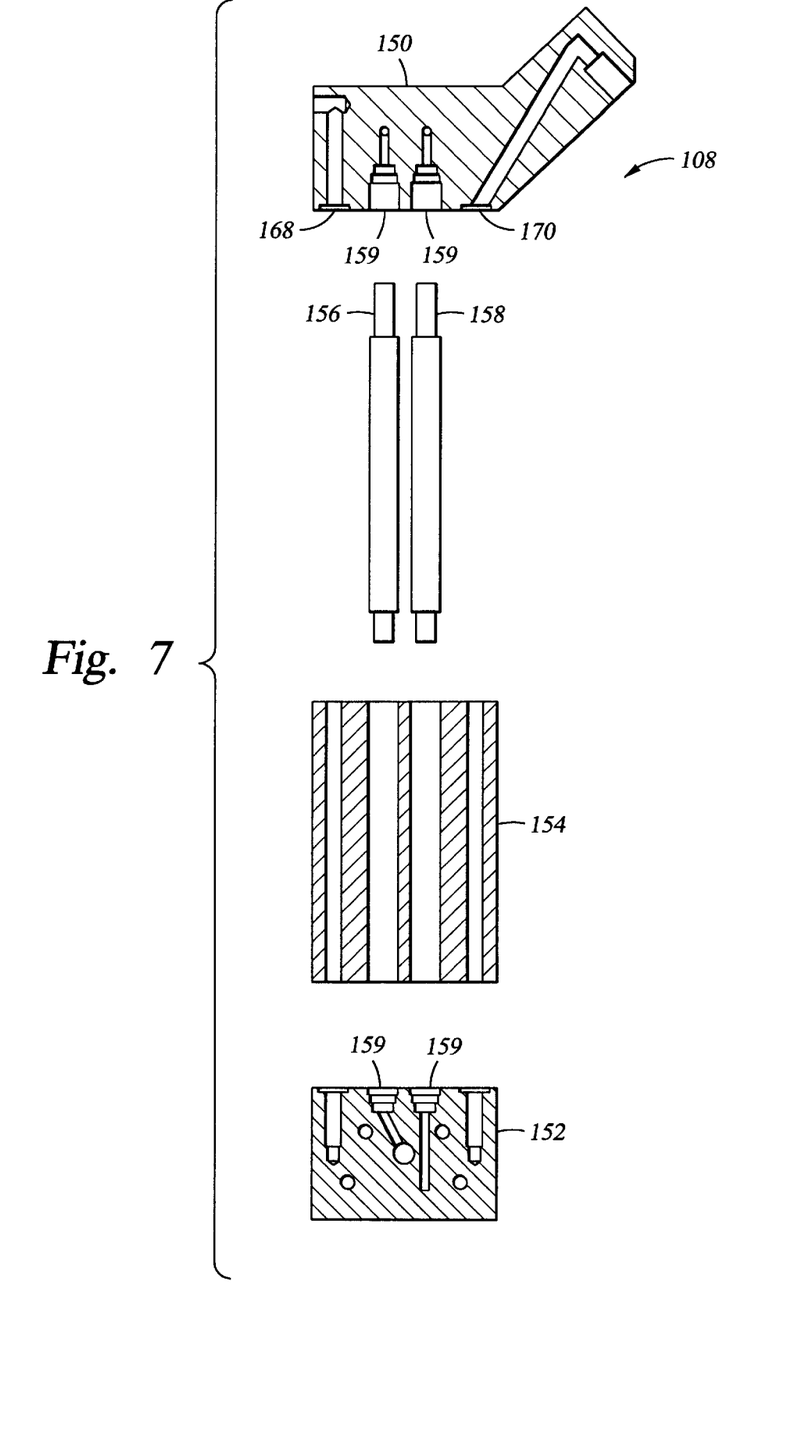
FIG. 7 is an exploded sectional view of a gas feedthrough in a vertical orientation.

The gas feedthrough 108, shown in a vertical exploded sectional view in FIG. 7, mounts the gas injection plate 110, shown in FIG. 3 and comprises an inlet manifold 150, an outlet manifold 152, and a housing 154 interposed therebetween. A first gas tube 156 and a second gas tube 158 extend through the housing 154 to separately route two process gases therethrough. Two pairs of ports 159 are formed in the inlet manifold 150 and outlet manifold 152, respectively, to receive the first gas tube 156 and the second gas tube 158 at their respective ends. The gas tubes 156, 158 are shown as parallel to one another in FIG. 7, but may also be concentric, thereby coaxially delivering the gases separately into and through the gas feedthrough 108. The ports 159 formed in the inlet manifold 150 are aligned with gas delivery channels 162, 164 formed through the chamber body and the lid. The gas delivery channels 162, 164 are connected to the first supply line 120 and second supply line 122, respectively, at the bottom of the chamber body 101. A first container 116 and second container 118 are located upstream to supply the precursors to the gas distribution assembly 104 via a first supply line 120 and second supply line 122, respectively.

Flow controllers 124 are disposed in the supply lines 120, 122 to regulate the flow rates of the precursors. A vaporizer 126 is disposed in the first supply line 120 to vaporize a liquid precursor, such as hydrogen peroxide.

The gas feedthrough 108 provides for a first fluid feedthrough tube 168 and second fluid feedthrough tube 170 each connected to fluid delivery hoses 172 at a pair of quick-disconnect fittings 174, shown in FIG. 3. The fluid feedthrough tubes 168, 170 circulate a heat transfer fluid through an annular fluid passageway 180 formed in the gas injection cover plate 110 via coolant fluid inlet channel 176 and a coolant fluid outlet channel 178.

A central bore 182, shown in FIG. 3, disposed through the gas injection cover plate 110, houses a coaxially disposed gas conduit 184, which delivers a gas to second gas pathway 216, shown in FIGS. 5 and 6 which includes the second set of horizontal channels 222. The conduit 184 channels a second gas into the nozzle 224 which is received at a lower end of the conduit 184. The central bore 182 and the perimeter of the conduit 184 define a gas delivery passage 186, which delivers a gas above the blocker plate 112 and into the first set of vertical channels, shown in FIG. 3. The perforated blocker plate 112, suspended by screws 196, is horizontally disposed within the upper region 190. The blocker plate 112 is perpendicularly intersected by the gas conduit 184, which traverses the upper region 190 and terminates near the top surface 210, so that the conduit 184 and the top surface 210 are in mating abutment and hermetically sealed by an O-ring 198.

FIG. 3 also shows a remote cooler 134 connected to the substrate support member 130 by coolant lines 135. A liquid coolant such as water, ethylene, glycol, or the like is delivered to the substrate support member 130, circulated through a spiraling cooling channel 137, and then circulated back to the cooler 134. The circulation of the fluid allows the temperature of the substrate support member 130 to be controlled. To ensure a highly efficient heat exchange, the substrate support member 130 is preferably made of aluminum, because of its excellent thermal conductive properties as well as its resistance to the corrosive effects of the chemical precursors. FIG. 3 shows a plurality of grooves 138 formed in the substrate seating surface 128. A substrate backside vacuum is achieved by attaching a vacuum pump 140 to the substrate support member 130 in communication with the grooves 138.

In operation, the substrate 103 is positioned onto the substrate support member 130 by an external robot (not shown) through a slit valve aperture (also not shown) formed in the chamber body 101. A first gas is then supplied from the first gas container 116 and a second gas is supplied by the second gas container 118. The first and second gases are channeled through the chamber body 101 via gas delivery channels 162 and 164, respectively, and then flown through the gas feedthrough 108. The first gas is then routed through the gas delivery passage 186, while the second gas is routed through the delivery conduit 184. The first gas is delivered into the upper region 190, above the blocker plate 112, where the blocker plate 112 acts as an initial dispersion stage, forcing the first gas to pervade upper region 190 and diffuse over the upper surface of the blocker plate 112. The first gas then migrates through the perforations in the blocker plate 112, uniformly impinges on the top surface 210, and ultimately migrates through the first set of vertical channels 226 into the process region 102 as shown by pathway arrows A in FIG. 5. Simultaneously, the second gas is channeled through the nozzle 224, and is diffused throughout the second gas pathway 216, shown in FIG. 5, including the set of interconnected horizontal channels 222. The second gas then flows through the second set of vertical channels 228 into the process region 102, where it reacts with the first gas. The pathway of the second gas is shown in FIG. 5 by arrows B.

The precursors used and the particular chamber conditions applied, such as temperature and pressure, depend on the desired reaction and film composition. However, the chamber 100 is particularly suited for plasma-less condensation reactions, such as between methylsilane and hydrogen peroxide, wherein the reactants are not mixed prior to entering the processing region 102 and the substrate 103 is preferably maintained at a low temperature. The particular deposition process involving methylsilane and hydrogen peroxide is preferably performed while maintaining the substrate 103 between about −20° C. to 25° C.

Figure 8:
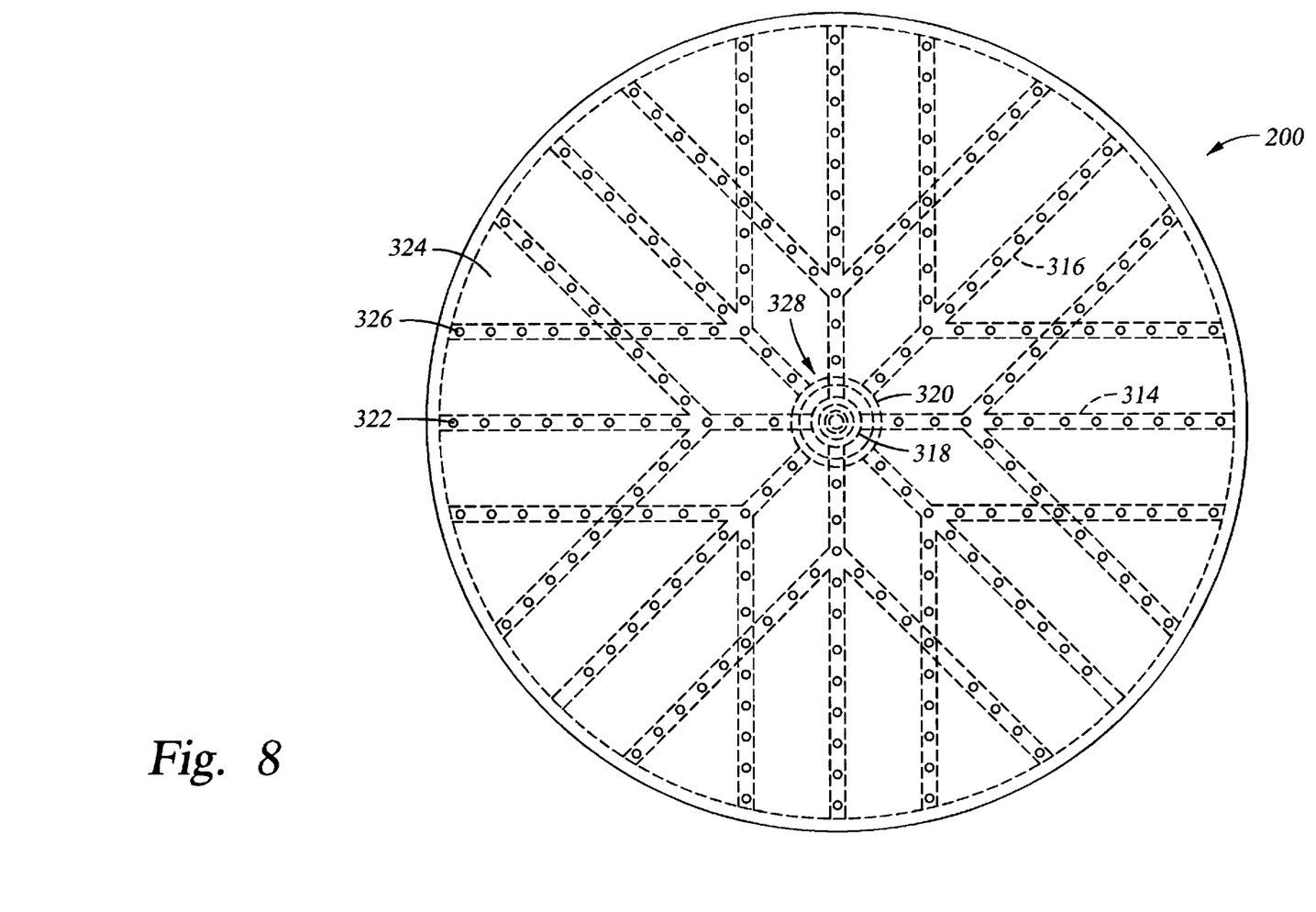
FIG. 8 is a bottom view of another embodiment of the present invention, having multiple horizontal layers vertically offset from each other.
Figure 9:
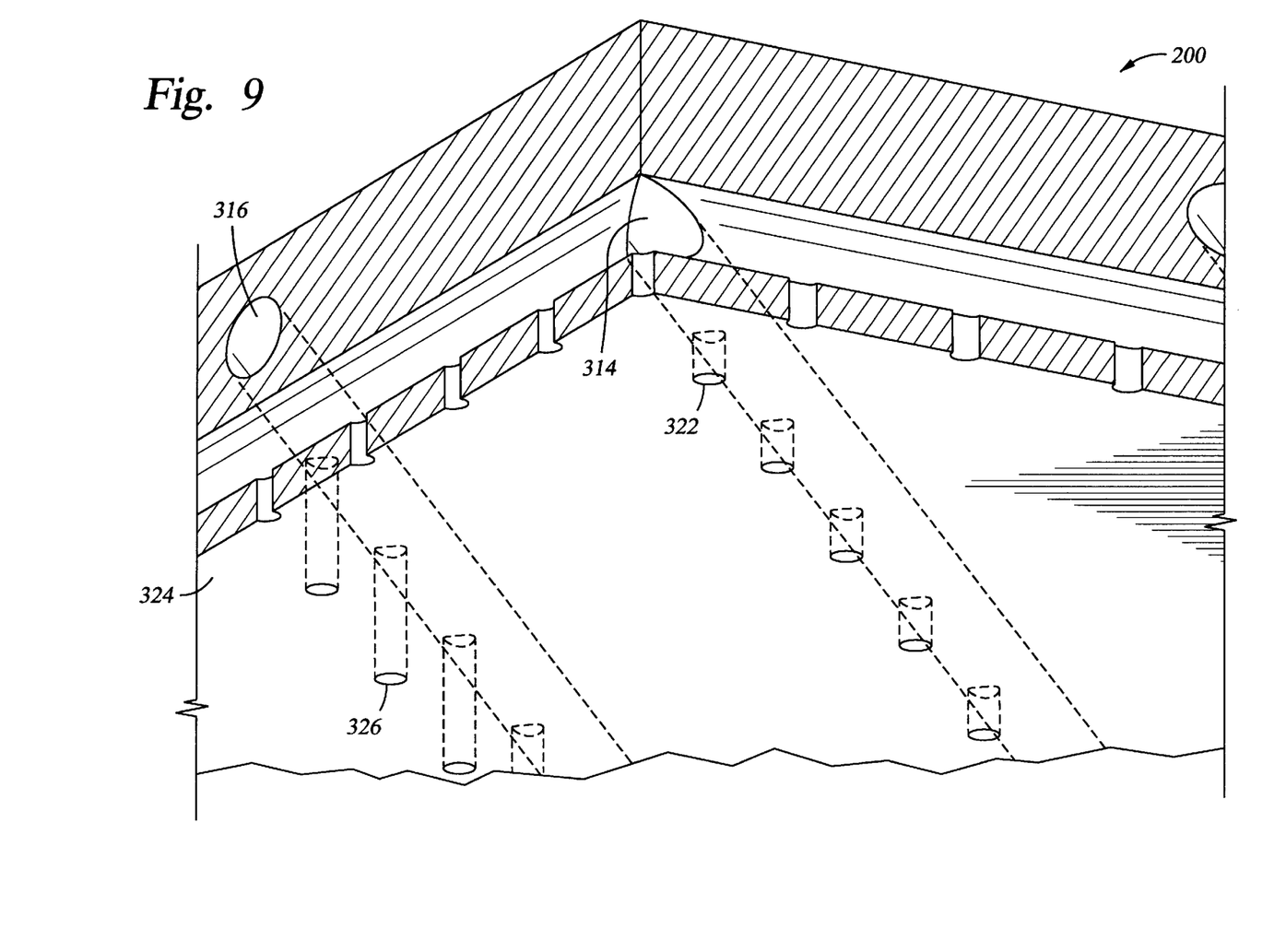
FIG. 9 is a partial cross sectional perspective view of the embodiment shown in FIG. 8.

FIGS. 8 and 9 illustrate an alternative embodiment of the faceplate 200. This embodiment applies a multi-tiered approach, whereby a first set of horizontal channels of a first gas pathway is vertically offset from a second set of horizontal channels of a second gas pathway. The faceplate 200 is shown, having a first set of horizontal channels 314 coplanar with a second set of horizontal channels 316. A centrally located first gas supply pipe 318 delivers a first gas to the first set of horizontal channels 314, while a coaxial second gas supply pipe 320 delivers a second gas to the second set of horizontal channels 316. A first set of vertical channels 322 is formed through a lower surface 324 to provide for fluid flow from the first set of horizontal channels 314 to a region below the faceplate 200. Similarly, a second set of vertical channels 326 is formed in the lower surface 324 to provide fluid flow from the second set of horizontal channels 316 to the region below the faceplate 200.

FIG. 8 shows a bottom view of faceplate 200 with the horizontal channels 314, 316 radially extending from a central hub 328, or cavity, wherein the horizontal channels 314, 316 originate. However, the channels 314, 316 may take on the design of the interconnecting horizontal channels 222 shown in FIGS. 5–6 or other designs, as the marketplace and manufacturing concerns direct. Furthermore, the multi-tiered concept of FIGS. 8 and 9 may be extrapolated to devise a faceplate capable of separately delivering three or more gases simply by adding additional tiers of horizontal channels, each communicating with separate vertical channels.

The latter embodiment has the added advantage of dispensing with the need for a blocker plate 112, shown in FIG. 3. Because the reactant gases are delivered directly to the radial horizontal channels 314, 316 by pipes 318 and 320, a blocker plate is unnecessary. Thus, the chamber 100 of FIG. 3 may be modified so that the first gas supply pipe 318 and second gas supply pipe 320 are connected directly to the manifold ports 159, formed in the inlet manifold 150, shown in FIG. 6.

Figure 10:
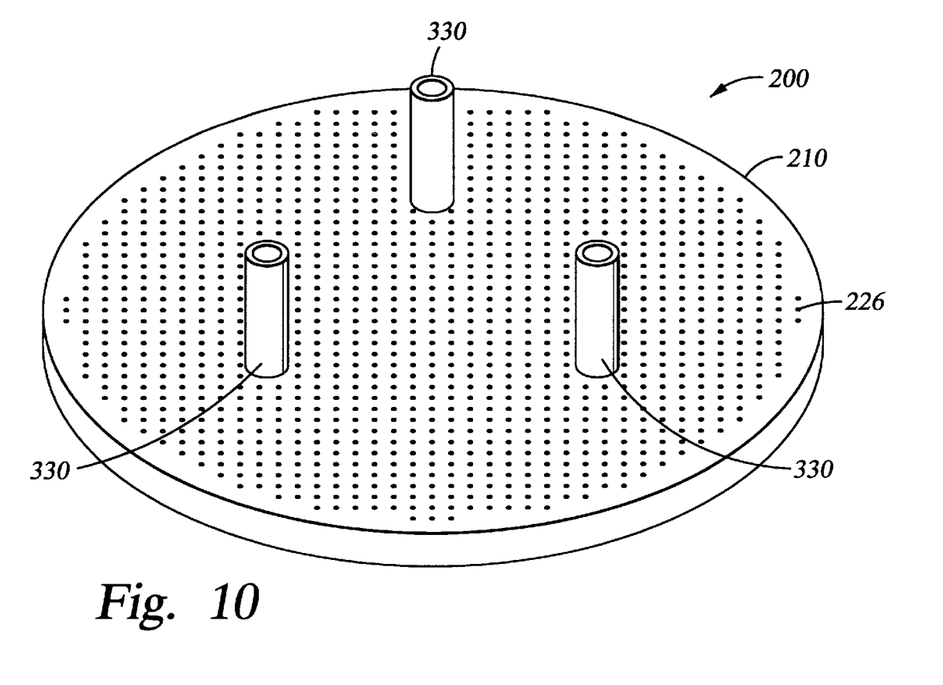
FIG. 10 is perspective view of another embodiment of the present invention, having separate nozzles.
Figure 11:
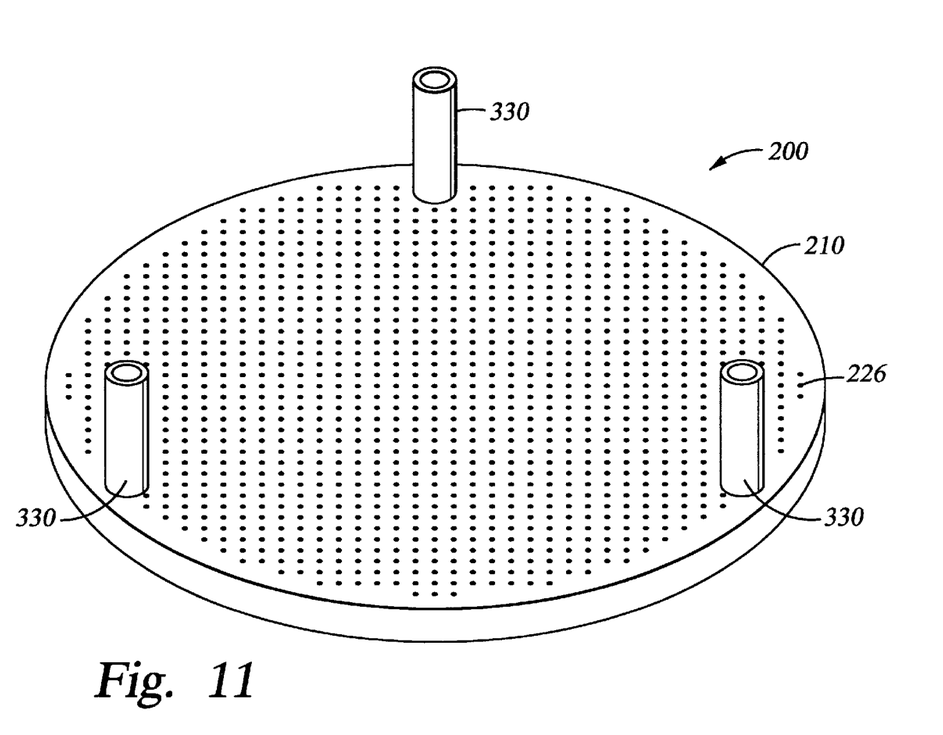
FIG. 11 is perspective view of another embodiment of the present invention, having separate nozzles disposed about the periphery of the faceplate.

FIGS. 10 and 11 show additional embodiments of the present invention. FIG. 10 shows a plurality of nozzles 330 (three shown) equally spaced around a central portion of the faceplate 200. Alternatively, FIG. 11 shows the nozzles 330 disposed around the perimeter portion of the faceplate 200. Although only two patterns are shown here, a person skilled in the art will recognize additional geometric configurations.

Figure 12:
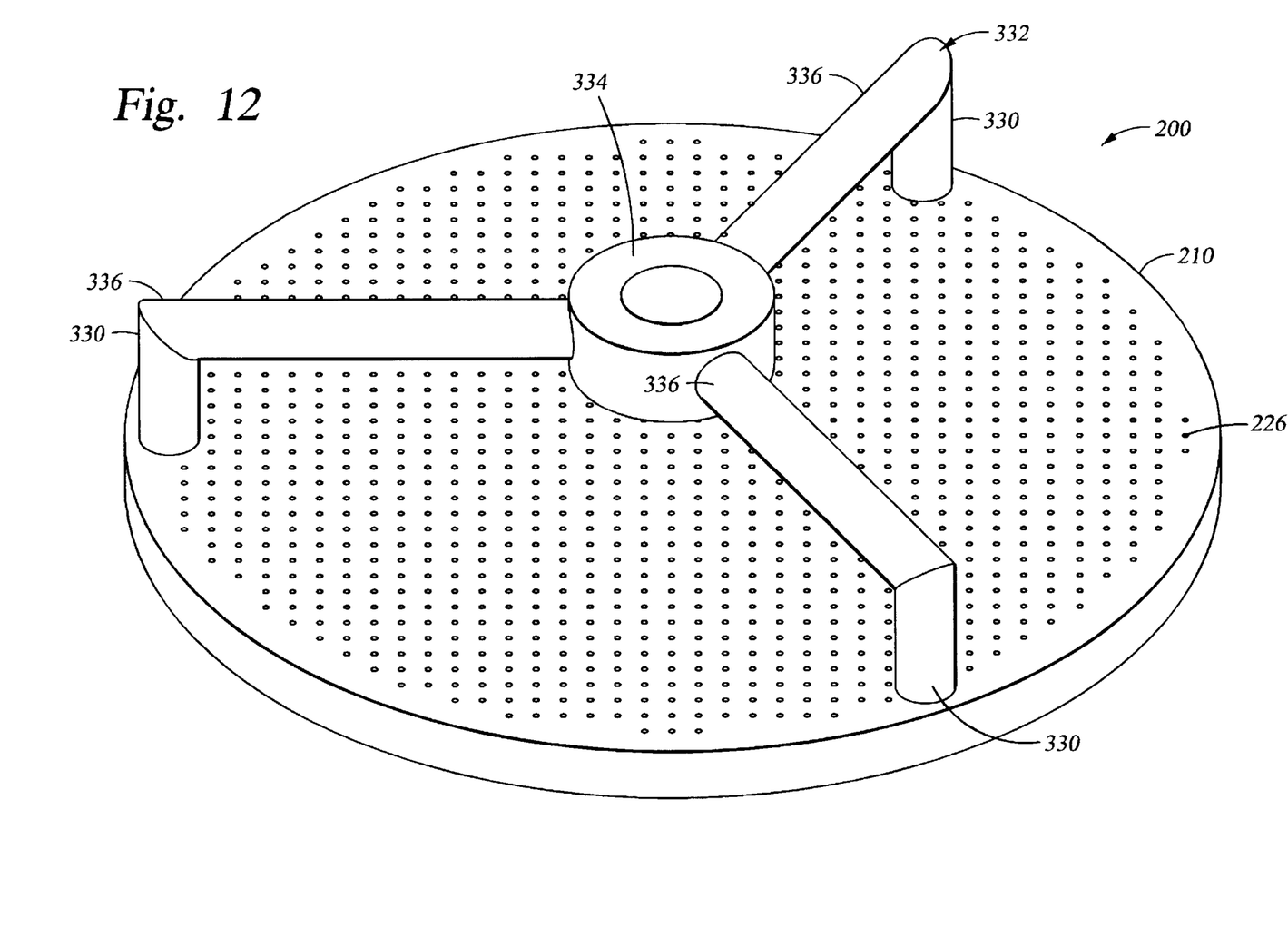
FIG. 12 is perspective view of another embodiment of the present invention, having a multi-pronged manifold.

FIG. 12 is a perspective view of an alternative embodiment of a gas delivery system of the invention. A multi-pronged manifold 332 is provided to deliver a gas from a central feed to the outer portion of the gas faceplate. A manifold inlet 334 is then mounted to the conduit 184 similar to the nozzle 224, described above in reference to FIG. 5. A plurality of manifold outlet conduits 336 are coupled to the nozzles to deliver a gas into the second gas pathway 216, shown in FIG. 5. In operation, the first gas is flown through the first set of vertical channels 226 and into the processing region 102, shown in FIG. 3. Simultaneously, the second gas is flown into the manifold inlet 334. The second gas is then delivered into the second gas pathway 216 of the faceplate 200 by the set of manifold outlet conduits 336 and uniformly delivered to the process region 102 via the second set of vertical channels 228, shown in FIG. 5.

EXAMPLE

As noted above, the present invention is particularly suited for forming $SiO_2$ films by reacting methlysilane with hydrogen peroxide. The methlysilane and the hydrogen peroxide are delivered separately into the processing chamber. The process steps of the reaction are believed to be as follows:

step 1   $SiH_3CH_3 + H_2O_2 \longrightarrow$

Step 1 is performed on a cold substrate, preferably between about −20° C. to 25° C., to yield a silanol-type compound. Step 2 describes a condensation reaction wherein a conformal porous $SiO_2$ network is achieved. The substrate is then heated to dehydrate the films and form a porous oxide.

While the foregoing is directed to a preferred embodiment of the invention, other and further embodiments of the invention may be devised without departing from the basic scope of thereof, and the scope thereof is determined by the claims which follow.

What is claimed is:

1. An apparatus for distributing gas in a processing system, comprising:
   a) a monolithic multi-channel faceplate adapted to disperse gases into a process chamber;
   b) a first gas pathway disposed through the monolithic multi-channel faceplate adapted to deliver a first gas to the process chamber; and
   c) at least a second gas pathway disposed through the monolithic multi-channel faceplate, the second gas pathway adapted to deliver at least a second gas to the process chamber substantially separate from the first gas prior to delivery to the process chamber.

2. The apparatus of claim 1, wherein the first gas pathway comprises a first set of vertical channels and the second gas pathway comprises a set of horizontal channels intersecting a second set of vertical channels separate from the first set of vertical channels.

3. The apparatus of claim 1, further comprising a first manifold upstream from the multi-channel faceplate to deliver the first gas to the faceplate and a second gas conduit separate from the first manifold to deliver the second gas to the second gas pathway.

4. The apparatus of claim 3, wherein at least a portion of the first manifold is coaxial with the second gas conduit to the second gas pathway.

5. The apparatus of claim 2, wherein the second set of vertical channels perpendicularly intersects the horizontal channels.

6. The apparatus of claim 2, wherein the first set of vertical channels is aligned with the second set of vertical channels.

7. The apparatus of claim 2, wherein the first set of vertical channels is offset from the second set of vertical channels.

8. The apparatus of claim 1, further comprising a first set of horizontal channels intersecting a first set of vertical channels for the first gas pathway and a second set of horizontal channels disposed vertically offset from the first set of horizontal channels and intersecting a second set of vertical channels separate from the first set of vertical channels for the second gas pathway.

9. The apparatus of claim 1, further comprising a plurality of separate nozzles fluidly connected to the second gas pathway adapted to deliver the second gas to the second gas pathway.

10. The apparatus of claim 1, further comprising a central feed fluidicly connected to a multi-pronged manifold wherein the multi-pronged manifold is fluidly connected to a plurality of separate nozzles adapted to deliver the second gas to the second gas pathway.

11. The apparatus of claim 1, further comprising a seal disposed about the periphery of the faceplate to seal the horizontal channels extending to the periphery.

12. An apparatus for distributing gas in a processing system, comprising:
   a) a multi-channel faceplate adapted to disperse gases into a process chamber;
   b) a first gas pathway through the faceplate comprising a first set of horizontal channels intersecting a first set of vertical channels for a first gas; and
   c) at least a second gas pathway through the faceplate comprising a second set of horizontal channels disposed vertically offset from the first set of horizontal channels and intersecting a second set of vertical channels separate from the first set of vertical channels.

13. The apparatus of claim 12, further comprising a plurality of separate nozzles fluidly connected to the second gas pathway and adapted to deliver the second gas to the second gas pathway.

14. A semiconductor processing apparatus, comprising:
   (a) a process chamber; and
   (b) a gas distribution system connected to the process chamber, the gas distribution system comprising:
      (i) a gas feedthrough fluidicly connected to a first and second gas source;
      (ii) a gas injection cover plate fluidicly connected to the gas feedthrough; and
      (iii) a monolithic multi-channel faceplate connected to the gas injection cover plate, the faceplate adapted for the separate delivery to the process chamber of two or more gases.

15. An apparatus for distributing gas in a processing system, comprising:
   a) a monolithic multi-channel faceplate;
   b) a first gas pathway having a first set of vertical channels disposed through the monolithic multi-channel faceplate; and
   c) at least a second gas pathway disposed through the monolithic multi-channel faceplate, the second gas pathway having a set of horizontal channels intersecting a second set of vertical channels separate from the first set of vertical channels.

16. The apparatus of claim 15, further comprising a first manifold disposed upstream from the multi-channel faceplate and a second gas conduit separate from the first manifold.

17. The apparatus of claim 15, wherein the second set of vertical channels perpendicularly intersect the horizontal channels.

18. The apparatus of claim 15, wherein the first set of vertical channels is aligned with the second set of vertical channels.

19. The apparatus of claim 15, wherein the first set of vertical channels is offset from the second set of vertical channels.

* * * * *